United States Patent
Murano et al.

(10) Patent No.: US 9,112,175 B2
(45) Date of Patent: Aug. 18, 2015

(54) ORGANIC COMPONENT

(75) Inventors: Sven Murano, Dresden (DE); Jan Birnstock, Dresden (DE); Ansgar Werner, Dresden (DE); Martin Vehse, Dresden (DE); Michael Hofmann, Dresden (DE)

(73) Assignee: Novaled AG, Dresden (DE)

( * ) Notice: Subject to any disclaimer, the term of this patent is extended or adjusted under 35 U.S.C. 154(b) by 685 days.

(21) Appl. No.: 12/158,482

(22) PCT Filed: Dec. 21, 2006

(86) PCT No.: PCT/EP2006/012403
§ 371 (c)(1),
(2), (4) Date: Sep. 19, 2008

(87) PCT Pub. No.: WO2007/076960
PCT Pub. Date: Jul. 12, 2007

(65) Prior Publication Data
US 2009/0009071 A1 Jan. 8, 2009

(30) Foreign Application Priority Data
Dec. 21, 2005 (EP) .................................. 05028081

(51) Int. Cl.
*H01J 63/04* (2006.01)
*H01L 51/50* (2006.01)

(52) U.S. Cl.
CPC ........ *H01L 51/5052* (2013.01); *H01L 51/5088* (2013.01); *H01L 51/5092* (2013.01)

(58) Field of Classification Search
CPC .................................................. H01L 51/5052
USPC .................................. 313/498–512
See application file for complete search history.

(56) References Cited

U.S. PATENT DOCUMENTS

| 4,356,429 A | 10/1982 | Tang |
| 4,769,292 A | 9/1988 | Tang et al. |

(Continued)

FOREIGN PATENT DOCUMENTS

| CA | 2549309 | 9/2005 |
| DE | 19916745 | 10/2000 |

(Continued)

OTHER PUBLICATIONS

English translation of WO 2004/052057 A1 (Jun. 2004).*
(Continued)

*Primary Examiner* — Anh Mai
*Assistant Examiner* — Hana Featherly
(74) *Attorney, Agent, or Firm* — Sutherland Asbill & Brennan LLP

(57) ABSTRACT

The invention relates to an organic component, in particular a light-emitting organic component, having an electrode (1; 2) and a counter electrode (2; 1) and also an arrangement of organic layers (3) which is arranged between the electrode (1; 2) and the counterelectrode (2; 1) and which is in electrical contact with the electrode (1; 2) and the counterelectrode (2; 1), the arrangement of organic layers (3) comprising charge carrier transport layers (4, 8) for transporting charge carriers injected from the electrode (1; 2) and from the counterelectrode (2; 1) into the arrangement of organic layers (3), and with an injection layer (5; 9) made from a molecular doping material being formed in the arrangement of organic layers (3) between the electrode (1; 2) and a charge carrier transport layer (4; 8) arranged opposite to the electrode (1; 2), which injection layer is in contact with the charge carrier transport layer (4; 8) arranged opposite to the electrode (1; 2), the molecular doping material having a molecular weight of at least 300 g/mol.

31 Claims, 3 Drawing Sheets

(56) References Cited

U.S. PATENT DOCUMENTS

| | | |
|---|---|---|
| 5,093,698 A | 3/1992 | Egusa |
| 5,500,537 A | 3/1996 | Tsumura et al. |
| 5,703,436 A | 12/1997 | Forrest et al. |
| 5,757,026 A | 5/1998 | Forrest et al. |
| 5,811,833 A | 9/1998 | Thompson |
| 5,840,217 A | 11/1998 | Lupo et al. |
| 5,917,280 A | 6/1999 | Burrows et al. |
| 5,969,474 A | 10/1999 | Aria |
| 5,989,785 A | 11/1999 | Ishihara et al. |
| 6,023,073 A | 2/2000 | Strite |
| 6,107,734 A | 8/2000 | Tanaka et al. |
| 6,274,980 B1 | 8/2001 | Burrows et al. |
| 6,303,238 B1 | 10/2001 | Thompson et al. |
| 6,310,360 B1 | 10/2001 | Forrest et al. |
| 6,337,492 B1 | 1/2002 | Jones et al. |
| 6,406,804 B1 | 6/2002 | Higashi |
| 6,437,769 B1 | 8/2002 | Kohayashi |
| 6,555,840 B1 | 4/2003 | Hudson et al. |
| 6,566,807 B1 | 5/2003 | Fujita et al. |
| 6,573,651 B2 | 6/2003 | Adachi et al. |
| 6,579,422 B1 | 6/2003 | Kasinuma |
| 6,580,027 B2 | 6/2003 | Forrest et al. |
| 6,589,673 B1 | 7/2003 | Kido et al. |
| 6,645,645 B1 | 11/2003 | Adachi et al. |
| 6,720,573 B2 | 4/2004 | Son |
| 6,734,457 B2 | 5/2004 | Yamazaki |
| 6,835,470 B1 | 12/2004 | Magain |
| 6,867,538 B2 | 3/2005 | Adachi et al. |
| 6,878,297 B1 | 4/2005 | Berger |
| 6,897,473 B1 | 5/2005 | Burroughes et al. |
| 6,900,588 B2 | 5/2005 | Adachi et al. |
| 6,908,783 B1 | 6/2005 | Kuehl et al. |
| 6,911,666 B2 | 6/2005 | Voutsas |
| 6,933,522 B2 | 8/2005 | Lin |
| 6,936,961 B2 | 8/2005 | Liao et al. |
| 6,965,197 B2 | 11/2005 | Tyan |
| 6,979,414 B2 | 12/2005 | Hosokawa et al. |
| 7,001,536 B2 | 2/2006 | Thompson et al. |
| 7,074,500 B2 | 7/2006 | Pfeiffer |
| 7,161,292 B2 | 1/2007 | Leo |
| 7,301,167 B2 | 11/2007 | Ko |
| 7,355,197 B2 | 4/2008 | Blochwitz-Nimoth et al. |
| 7,473,410 B1 | 1/2009 | Huffman et al. |
| 2001/0019782 A1* | 9/2001 | Igarashi et al. ............... 428/690 |
| 2001/0033136 A1 | 10/2001 | Kawase |
| 2002/0030440 A1 | 3/2002 | Yamazaki |
| 2002/0041975 A1 | 4/2002 | Ueda et al. |
| 2002/0048688 A1 | 4/2002 | Fukuoka et al. |
| 2002/0071082 A1 | 6/2002 | Okita et al. |
| 2002/0084993 A1 | 7/2002 | Teneya |
| 2002/0098379 A1 | 7/2002 | Arakane |
| 2002/0109136 A1 | 8/2002 | Seo et al. |
| 2003/0020073 A1 | 1/2003 | Long et al. |
| 2003/0042848 A1 | 3/2003 | Park et al. |
| 2003/0052616 A1 | 3/2003 | Antoniadis et al. |
| 2003/0098946 A1 | 5/2003 | Blaessing et al. |
| 2003/0127973 A1 | 7/2003 | Weaver et al. |
| 2003/0146443 A1 | 8/2003 | Tokada |
| 2003/0170491 A1 | 9/2003 | Liao et al. |
| 2003/0178619 A1 | 9/2003 | Forrest et al. |
| 2003/0189401 A1 | 10/2003 | Kido et al. |
| 2003/0230980 A1 | 12/2003 | Forrest et al. |
| 2004/0012980 A1 | 1/2004 | Sigiura et al. |
| 2004/0032220 A1 | 2/2004 | Cok et al. |
| 2004/0062949 A1 | 4/2004 | Pfeiffer et al. |
| 2004/0067324 A1 | 4/2004 | Lazarev et al. |
| 2004/0104394 A1 | 6/2004 | Lin et al. |
| 2004/0113547 A1 | 6/2004 | Son |
| 2004/0119400 A1 | 6/2004 | Takahashi et al. |
| 2004/0150330 A1 | 8/2004 | Suh et al. |
| 2004/0183067 A1 | 9/2004 | Strip et al. |
| 2004/0191952 A1 | 9/2004 | Shtein et al. |
| 2004/0201018 A1 | 10/2004 | Yamahara et al. |
| 2004/0211956 A1* | 10/2004 | Kanno et al. .................... 257/40 |
| 2004/0214041 A1 | 10/2004 | Lu et al. |
| 2004/0227460 A1 | 11/2004 | Liao et al. |
| 2004/0235209 A1 | 11/2004 | Hasegawa et al. |
| 2004/0251816 A1 | 12/2004 | Leo et al. |
| 2005/0029933 A1 | 2/2005 | Liao et al. |
| 2005/0040390 A1 | 2/2005 | Pfeiffer et al. |
| 2005/0040392 A1 | 2/2005 | Wu et al. |
| 2005/0053801 A1 | 3/2005 | Eischner et al. |
| 2005/0061232 A1 | 3/2005 | Werner et al. |
| 2005/0073251 A1 | 4/2005 | Kato |
| 2005/0086251 A1 | 4/2005 | Hatscher et al. |
| 2005/0095736 A1 | 5/2005 | Padiyath et al. |
| 2005/0110009 A1* | 5/2005 | Blochwitz-Nimoth et al. 257/40 |
| 2005/0118745 A1 | 6/2005 | Yamazaki et al. |
| 2005/0147842 A1* | 7/2005 | Hirayama et al. ............ 428/690 |
| 2005/0173700 A1 | 8/2005 | Liao et al. |
| 2005/0189875 A1 | 9/2005 | Nakada |
| 2005/0218797 A1 | 10/2005 | Bechtel et al. |
| 2005/0255334 A1 | 11/2005 | Kang et al. |
| 2005/0269943 A1 | 12/2005 | Hack et al. |
| 2005/0270279 A1 | 12/2005 | Giraldo et al. |
| 2006/0033115 A1 | 2/2006 | Blochwitz et al. |
| 2006/0038170 A1 | 2/2006 | Brunschwiler et al. |
| 2006/0061266 A1 | 3/2006 | Kang et al. |
| 2006/0065904 A1 | 3/2006 | Uemura et al. |
| 2006/0145365 A1 | 7/2006 | Halls et al. |
| 2006/0202196 A1 | 9/2006 | Kawakami et al. |
| 2006/0231843 A1 | 10/2006 | Qin et al. |
| 2006/0232992 A1 | 10/2006 | Bertram et al. |
| 2006/0238112 A1 | 10/2006 | Kasama et al. |
| 2006/0250076 A1 | 11/2006 | Hofmann et al. |
| 2006/0273310 A1 | 12/2006 | Birnstock et al. |
| 2007/0018568 A1* | 1/2007 | Nagara et al. ................. 313/504 |
| 2007/0034860 A1 | 2/2007 | Nakamura et al. |
| 2007/0051946 A1 | 3/2007 | Walzer et al. |
| 2007/0141396 A1* | 6/2007 | Chun et al. ................... 428/690 |
| 2007/0278479 A1 | 12/2007 | Werner et al. |
| 2008/0143250 A1 | 6/2008 | Blochwitz-Nimoth et al. |
| 2008/0164807 A1 | 7/2008 | Hofmann et al. |
| 2008/0203406 A1 | 8/2008 | He et al. |
| 2009/0009072 A1 | 1/2009 | Wellmann et al. |
| 2009/0212280 A1 | 8/2009 | Werner et al. |

FOREIGN PATENT DOCUMENTS

| | | |
|---|---|---|
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-150169 | 5/2000 |
| JP | 2000-231992 | 8/2000 |
| JP | 2003203769 | 7/2003 |
| JP | 2003297561 | 10/2003 |
| JP | 2004119197 | 4/2004 |
| JP | 2004-158216 | 6/2004 |
| JP | 2004214120 | 7/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |
| WO | WO 2004052057 A1 * | 6/2004 |
| WO | WO 2004/059606 | 7/2004 |

(56) References Cited

FOREIGN PATENT DOCUMENTS

| WO | WO 2004/097954 | 11/2004 |
|---|---|---|
| WO | WO 2005/008801 | 1/2005 |
| WO | WO 2005/089288 | 9/2005 |

OTHER PUBLICATIONS

Adachi, C. et al., "Efficient electrophosphorescence using a doped ambipolar conductive molecular organic thin film," Organic Electronics 2, (2001), pp. 37-43.
Adachi, C. et al., "High-efficiency organic electrophorescent devices with tris (2-phenylpyridine) iridium doped into electron-transporting materials," App. Phys. Lett. vol. 77, No. 6, Aug. 7, 2000.
Adachi, C. et al., "Nearly 100% internal phosphorescence efficiency in an organic light emitting device," Journal of Applied Physics (2001), vol. 90:10, pp. 5048-5051.
Adachi, et al. "Electroluminescence in Organic Films with Three-Layer Structure," Japanese Journal of Applied Physics, 27, L269 (1988).
Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).
Ammermann, D. et al., "Photonic devices based on crystalline organic semiconductors for optoelectronic integrated circuits," Jps. J. Appl. Phys. Pt. 1 (1995) vol. 34, pp. 1293-1297.
Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.
Baldo, et al. "Highly efficient phosphorescent emission from organic electroluminescent devices," Nature, vol. 395, Sep. 10, 1998, pp. 151-154.
Baldo, M. A. et al., "High efficiency fluorescent organic light-emitting devices using a phosphorescent sensitizer," Nature, (2000), vol. 403, pp. 750-753.
Baldo, M. A. et al., "Transient analysis of organic electrophosphorescence: I. Transient analysis of triplet energy transfer," Physical Review B, (2000), vol. 62:16, pp. 10958-10966.
Baldo, M. A. et al., "Very high-efficiency green organic light-emitting devices based on electrophosphorescence," Applied Physics Letters, (1999), vol. 75:1, pp. 4-6.
Baldo, M. A., et al., "Transient analysis of organic electrophosphorescence II. Transient analysis of triplet-triplet annihilation," Physical Review B, (2000), vol. 62:16, pp. 10967-10977.
Baldo, M., et al., "Organic vapor phase deposition," Advanced Materials, 1998, 10, No. 18, pp. 1505-1514.
Bandyopadhyay, A, et al. "Large conductance switching and memory effects in organic molecules for data-storage applications," Appl. Phys. Lett. 82, 1215 (2003).
Bard, A. J., Faulkner, R.J., Electrochemical Methods: Fundamentals and Applications, Wiley, 2nd Ed., 2000 (Chapter 2).
Bard, A. J., Faulkner, R.J., Electrochemical Methods: Fundamentals and Applications, Wiley, 2nd Ed., 2000 (Chapter 6).
Bastard, G., "Wave mechanics applied to semiconductor heterostructures," The Editions of Physique, (1988) pp. 64-67.
Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.
Baumgartel, H. et al., "Polarographische Untersuchungen zur Konformation von 1.2.3.4.5-pentaarylimidazoliumkationen," Ber. Bunsenges (1972) 76/2, 94-100.
Bernanose, Andre et al. "Sur un nouvea mode d'emission lumineuse chez certains composes organiques," J. de Chimie Physique, 1953, No. 1, pp. 64-68.
Birnstock, J. et al., "High Efficiency Top Emitting OLEDs on a-Si Active Matrix Backplanes with Large Aperture Ratio," OLED1: Panel, IDW '04, Dec. 8, 2004.

Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=d1&dok_ext=pdf&filename=963580051.pdf.
Blochwitz, J. et al., "Interface electronic structure of organic semiconductors with controlled doping levels," Org. Electronics 2, 97 (2001).
Blochwitz, J., et al., "Low voltage organic light emitting diodes featuring doped phthalocyanine as hole transport material," Applied Physics Letters, vol. 73, No. 6, Aug. 10, 1998, pp. 729-731.
Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.
Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.
Carter, S. A. et al., "Enhanced luminance in polymer composite light emitting devices," Appl. Phys. Lett., vol. 71, pp. 1145-1147, Sep. 1997.
Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.
Colle, M. et al. "Switching and filamentary conduction in non-volatile organic memories," Organic Electronics, 7, 305-312 (Oct. 2006).
Connelly, N. G. et al., "Chemical Redox Agents for Organometallic Chemistry," Chem. Rev., 96, 877 (1996).
Cotton, F. et al., "Closed-shell molecules that ionize more readily than cesium," Science, vol. 298, No. 5600, pp. 1971-1974 (Dec. 6, 2002).
D'Andrade, B.W. et al., "Relationship between the ionization and oxidation potentials of molecular organic semiconductors," Organic Electronics 6, 2005, pp. 11-20.
D'Andrade, Brian W., "Operational stability of electrophosphorescent devices containing p and n doped transport layers," Applied Physics Letters, vol. 83, No. 19, Nov. 10, 2003, pp. 3858-3860.
D'Andrade, Brian W., et al., "Efficient organic electrophosphorescent white-light emitting device with a triple doped emissive layer," Advanced Materials, No. 7, 16, Apr. 5, 2004. pp. 624-628.
D'Andrade, Brian W., et al., "High-efficiency yellow double-doped organic light-emitting devices based on phosphorsensitized fluorescence," Appl. Phys. Lett., (2001), vol. 79:7, pp. 1045-1047.
Day et al. "The use of charge transfer interlayers to control hole injection in molecular organic light-emitting diodes," Thin Solid Films, 410 (2002) pp. 159-166.
Dodabalapur et al., "Organic transistors: Two-dimensional transport and improved electrical characteristics," Science, vol. 268, p. 270 (1995).
Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.
Feng, X.D. et al. "Ohmic Cathode for Low-Voltage Organic Light-Emitting Diodes," App. Phys. Lett., vol. 86, Article 143511 (Apr. 1, 2005): pp. 1-3.
Gao, W. et al., "Effect of electrical doping on molecular level alignment at organic-organic heterojunctions," Applied Physics Letters, vol. 82, No. 26, Jun. 30, 2003, pp. 4815-4817.
Gu, G. et al., "Transparent organic light emitting devices," Applied Physics Letters, (1996), vol. 68:19, pp. 2606-2608.
Gu, G., et al. "Transparent stacked organic light emitting devices. I. Design principles and transparent compound electrodes," Journal of Applied Physics, 1999, vol. 86, No. 8, pp. 4067-4075.
Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).
Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

(56) References Cited

OTHER PUBLICATIONS

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.
Harada, K. et al. "Ionized impurity scattering in n-doped C60 thin films," Applied Physics Letters, 91, 092118 (2007).
Harada, K. et al. "Organic Homojunction Diodes with a High Built-in Potential: Interpretation of the Current-Voltage Characteristics by a Generalized Einstein Relation," Phys. Rev. Lett. 94, 036601 (2005).
Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).
Hino, Yuichi et al., "Efficient low molecule phosphorescent organic light emitting diodes fabricated by wet-processing," Organic Electronics, Aug. 8, 2004, vol. 5, pp. 265-270.
Hong, Il-Hwa et al. "Effective hole injection of organic light-emitting diodes by introducing buckminsterfullerene on the indium tin oxide anode," Applied Physics Letters, 2005, 87, 063502-1.
Hu, Wenping et al., "Efficient red electroluminescence from devices having multilayers of a europium complex," Appl. Phys. Lett. vol. 77, No. 26, Dec. 25, 2000.
Huang, Jingsong et al., "Effect of well number on organic multiple-quantum-well electroluminescent device characteristics," Applied Physics Letters, (1998), vol. 73:23, pp. 3348-3350.
Huang, Jingsong et al., "Influence of the thickness and doping of the emission layer on the performance of organic light-emitting diodes with PiN structures," Journal of Applied Physics, (2003), vol. 93:2, pp. 838-844.
Huang, Jingsong et al., "Low operating voltage and high-efficiency organic multilayer electroluminescent devices with p-type doped hole injection layer," Jps. J. Appl. Phys., (2001), vol. 40, pp. 6630-6633.
Huang, Jingsong et al., "Low-voltage organic electroluminescent devices using pin structures," Applied Physics Letters, vol. 80, No. 1, Jan. 7, 2002, pp. 139-141.
Hughes, et al. "Electron transporting materials for organic electroluminescent and electrophosphorescent devices," Journal of Materials Chemistry (2005), vol. 15, pp. 94-107.
Hung, L.S. et al., "Recent progress of molecular organic electroluminescent materials and devices," Materials Science and Engineering Reports, 39, 2002, pp. 143-222.
Ikai, M. et al., "Highly Efficient Phosphorescence From Organic light-emitting devices with an exciton-block layer," Appl. Phys. Lett. vol. 79, No. 2, Jul. 9, 2001.
Ioannidis, A. et al., "Hole and electron transport in chloroaluminum phtalocyanin thin films," The Journal of Physical Chemistry B, 1997, vol. 101, pp. 5100-5107.
Ishii, M. et al., "Improvement of organic electroluminescent device performance by in situ plasma treatment of indium-tin-oxide surface," J. Lumin., 1165 (2000).
Kido, Junji; "Recent progress in organic light-emitting devices," Proceedings of the 1st International Display Manufacturing Conference IDMC 2000, Seoul Korea, Sep. 5, 2000, pp. 399-400.
Koch, N. et al., "Optimized hole Injection with Strong Acceptors at Organized-Metal Interfaces," Phys. Rev. Lett., vol. 95, pp. 237601-3, Nov. 30, 2005.
Krieger et al. "Molecular analogue memory cell based on electrical switching and memory in molecular thin films," Synthetic Metals, 122, 199-202 (May 2001).
Kwong, R.C. et al. "Current Status of Electrophosphorescent Device Stability," Org. Electr., vol. 4 (2003): pp. 155-164.
Kwong, Raymond C., et al., "High operational stability of electrophosphorescent devices," Applied Physics Letters, Jul. 1, 2002, vol. 81, No. 1, pp. 162-164.
Lambert, M.A., "Volume-controlled current injection in insulators," Rep. Progr. Phys. 27, 329 (1964).
Lee et al. "The Effect of C60 doping on the device performance of organic light-emitting diodes," Applied Physics Letters, 86 (2005) 063514 (3 pages).
Lee, et al. "Effects of hydroxyl groups in polymeric dielectrics on organic transistor performance," Applied Physics Letters, 88, 162109 (2006).
Liping, Ma et al. "Nonvolatile electrical bistability of organic/metal-nanocluster/organic system," Appl. Phys. Lett. 82, 1419-1421 (Mar. 3, 2003).
Lu, Ping et al., "Synthesis of octasubstituted cyclooctatetrainees and their use as electron transporters in organic light emitting diodes," Journal of the American Chemical Society, 2000, vol. 1222, 7480-7486.
Lupton, J. M. et al., "Bragg scattering from periodically microstructured light emitting diodes," Appl. Phys. Lett., vol. 77, pp. 3340-3342, Nov. 2000.
Ma, E.Y., et al. "Thin Film Transistors for Foldable Displays," IEEE Technical Digest, Electron Devices Meeting, 1997. IEDM '97. (Dec. 7-10, 1997): pp. 535-538.
Madigan, C.F. "Improvement of Output coupling efficiency of organic light emitting diodes by backside substrate modification," Appl. Phys. Lett., vol. 76, pp. 1650-1652, Mar. 2000.
Maennig, B. et al. "Controlled p-type doping of polycrystalline and amorphous organic layers: Self-consistent description of conductivity and field-effect mobility by a microscopic percolation model," Physical Review B, 64, 195208 (2001).
Matsumura, M. et al., "Analysis of current-voltage characteristics of organic light emitting diodes having a LiF/Al cathode and an Al-hydroxyquinoline/diamine junction," Applied Physics Letters, 2872 (1998).
Mattoussi, H. et al., "Photoluminescence quantum yield of pure and molecularly doped organic solid films," Journal of Applied Physics, (1999), vol. 86:5, p. 2642.
Miller, L.L. et al., "A simple comprehensive correlation of organic oxidation and ionization potentials," J. Org. Chem., 1972, vol. 37, No. 6, pp. 916-918.
Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.
Murata, Hideyuki et al., "Efficient organic light-emitting diodes with undoped active layers based on silole derivatives," Applied Physics Letters, Jan. 14, 2002, vol. 80, No. 2, p. 189-191.
Naito, Katsuyuki et al.; "Molecular design, synthesis, and physical properties of nonpolymeric amorphous dyes for electron transport," The Journal of Physical Chemistry A, 1997, vol. 101, pp. 2350-2357.
Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.
Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.
Pacios, R., et al., "Charge separation in polyfluorene composites with internal donor/acceptor heterojunctions," Synthetic Metals, 2002, vol. 127, pp. 261-265.
Parker, "On the Problem of Assigning Values to Energy Changes of Electrode Reactions," Journal of the American Chemical Society, 96:17, Aug. 21, 1974, pp. 5656-5661.
Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.
Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.
Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.
Pfeiffer, Martin et al., "Electrophosphorescent p-i-n organic light-emitting devices for very-high-efficiency flat-panel displays," Advanced Materials, (2002), vol. 14:22, Nov. 18, 2002, pp. 1633-1636.

(56) References Cited

OTHER PUBLICATIONS

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.

Redecker, M., et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Shinar, J. "Organic Light-Emitting Devices—A Survey" (Adachi et al. "Design concept of molecular materials for high-performance OLED" p. 43)) AIP-Press, Springer, New York 2004.

Shirota, Yasuhiko et al., "A novel class of emitting amorphous molecular materials as bipolar radical formants: 2-{4-[bis(4-methylphenylamino]phenyl{-5-(dimesitylborylthiophene) and 2-{4-[bis(9,9-dimethylfluorenylamino]phenyl{-5-(dimethylboryl)thiophene," Journal of the American Chemical Society, 2000, vol. 122, pp. 11021-11022.

Shirota, Yasuhiko; "Organic materials for electronic and optoelectronic devices," Journal of Materials Chemistry, 2000, vol. 10, pp. 1-25.

Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tang, T.B. et al., "Ionization thresholds of merocyanine dyes in the solid state," Journal of Applied Physics, vol. 59, (1), Jan. 1986, pp. 5-10.

Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo et al., "Improvement of emission efficiency in polymer light-emitting devices based on phosphorescent polymers," Thin Solid Films, Dec. 15, 2003, vol. 445, No. 2, pp. 353-357.

Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.

Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.

Vissenberg, M.C. et al. "Theory of the field-effect mobility in amorphous organic transistors," Physical Review B, 27, 12964 (1998).

Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.

Werner, A. G. et al., "Pyronin B as a donor for n-type doping of organic thin films," Applied Physics Letters, vol. 82, No. 25, Jun. 23, 2003, pp. 4495-4497.

Werner, A.G. et al., "n-Type Doping of Organic Thin Films Using Cationic Dyes," Adv. Funct. Mater., vol. 14, No. 3 (Mar. 2004): pp. 255-260.

Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.

Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.

Yamasaki, T. et al., "Organic Light emitting device with an ordered monolayer of silica microspheres as a scattering medium," Appl. Phys. Lett., vol. 76, pp. 1243-1245, Mar. 2000.

Yang, et al., 2003, "Self-assembly and Magnetic Properties of Cobalt Nanoparticles," Appl. Phys. Lett., 82(26): 4729.

Yang, Y. et al. "Organic electrical bistable devices and rewritable memory cells," Appl. Phys. Lett. 80, 2997 (2002).

Yao, Fu et al., "Quantum-chemical predictions of Absolute standard redox potentials of diverse organic molecules and free radicals in acetonitrile," J. Am. Chem. Soc. 2005, 127, pp. 7227-7234.

Yuan et al. "Fullerene-doped hole transport molecular films for organic light-emitting diodes," Applied Physics Letters, 86 (2005) 143509 (3 pages).

Zhi-Ming, Zhang; "Organic light emitting diodes based on new oxadiazole and pyrazoline derivatives," China Physics Letters, 2000, vol. 17, No. 6, pp. 454-456.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Zhou, X. et al., "Low-voltage inverted transparent vacuum deposited organic light-emitting diodes using electrical doping," Applied Physics Letters, vol. 81, No. 2, Jul. 29, 2002, pp. 922-924.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Canadian Search Report for Application No. 2543276; Aug. 24, 2009.
Non-final Office Action for U.S. Appl. No. 11/279,514; Jan. 14, 2010.
Response to Office Action for U.S. Appl. No. 11/279,514; Aug. 12, 2009.
Final Office Action for U.S. Appl. No. 11/279,514; May 13, 2009.
Response to Office Action for U.S. Appl. No. 11/279,514; Feb. 27, 2009.
Non-final Office Action for U.S. Appl. No. 11/279,514; Oct. 30, 2008.
Restriction Requirement for U.S. Appl. No. 11/279,514; Jul. 2, 2008.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinion for EP 06026743.2; Nov. 7, 2007.

(56) References Cited

OTHER PUBLICATIONS

International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.
Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Non-Final Office Action for U.S. Appl. No. 11/574,058; Dec. 9, 2009.
Disclosure Under 37 C.F.R. 1.56 for U.S. Appl. No. 12/158,482; Submitted Herewith.
Translation of Japanese Office Action for JP Application No. 2008-546267 mailed Oct. 18, 2011.
English Translation of the Official Letter issued to Taiwan Patent Application No. 095147537 (Mar. 29, 2013) (9 pages).

\* cited by examiner

ORGANIC COMPONENT

CROSS-REFERENCE TO RELATED APPLICATION

This is a submission pursuant to 35 U.S.C. 154(d)(4) to enter the national stage under 35 U.S.C. 371 for PCT/EP2006/012403 filed Dec. 21, 2006. Priority is claimed under 35 U.S.C. 119(a) and 35 U.S.C. 365(b) to European Patent Application No. 05028081.7 filed Dec. 21, 2005. The subject matters of PCT/EP2006/012403 and European Patent Application No. 05028081.7 are hereby expressly incorporated herein by reference.

The invention relates to an organic component having an electrode and a counter electrode and also an arrangement of organic layers which is arranged between the electrode and the counterelectrode and which is in electrical contact with the electrode and the counterelectrode, the arrangement of organic layers comprising charge carrier transport layers for transporting charge carriers injected from the electrode and from the counterelectrode into the arrangement of organic layers.

BACKGROUND OF THE INVENTION

Such components are known in various embodiments, in particular as light-emitting organic components. One type of light-emitting organic component is organic light-emitting diodes (OLEDs). Since the demonstration of low operating voltages by Tang et al. (cf. C. W. Tang et al., Appl. Phys. Lett. 51 (12), 913 (1987)), organic light-emitting diodes have been promising candidates for producing new lighting and display elements. All of these components comprise a sequence of thin layers of organic materials, which are preferably applied in vacuo by vapour deposition or processed in their polymeric or oligomeric form in solution. After electrical contacting by means of metal layers, as a result of which contacts are produced, they form a wide range of electronic or optoelectronic components, for example diodes, light-emitting diodes, photodiodes, transistors and gas sensors, which in terms of their properties compete with the established components based on inorganic layers.

In the case of organic light-emitting diodes, light is generated by the injection of charge carriers, namely electrons from an electrode and holes from a counterelectrode or vice versa, into an arrangement of organic layers arranged therebetween, as a result of an externally applied voltage, the subsequent formation of excitons (electron/hole pairs) in an active zone and the recombination of these excitons in an emission zone to produce light, and said light is emitted from the light-emitting diode.

The advantage of such organic-based components over conventional inorganic-based components, for example semiconductors such as silicon or gallium arsenide, lies in the fact that it is possible to produce elements with a very large surface area, that is to say large display elements (display panels, screens). The organic starting materials are relatively inexpensive compared to inorganic materials. Moreover, due to their low processing temperature compared to inorganic materials, these materials can be applied to flexible substrates, which opens up a large number of new applications in the field of display and lighting technology.

U.S. Pat. No. 5,093,698 describes an organic light-emitting diode of the PIN type (PIN-OLED), which is an organic light-emitting diode with doped charge carrier transport layers. In particular, use is made of three organic layers which are located between two electrodes. In said document, n-doped and p-doped layers improve the injection of charge carriers and the transport of holes and electrons into the respectively doped layer. The proposed structure consists of at least three layers comprising at least five materials.

The energy levels HOMO ("Highest Occupied Molecular Orbital") and LUMO ("Lowest Unoccupied Molecular Orbital") are preferably selected such that both types of charge carrier are "trapped" in the emission zone so as to ensure efficient recombination of electrons and holes. The restriction of the charge carriers to the emission zone is achieved by suitably selecting the ionization potentials or electron affinities for the emission layer and/or the charge carrier transport layer, which will be discussed in more detail below.

One prerequisite for generating visible light is that the excitons formed in the recombination zone have at least an energy that corresponds to the wavelength of the light to be emitted. Here, the highest energies are required to produce blue light, which has a wavelength in the range from 400 to 475 nm. In order to facilitate the injection of charge carriers from the charge transport layers into the emission zone, it is advantageous to use as matrix materials for these layers preferably materials which are adapted in terms of their energy levels to the emission zone such that there is the highest possible energy difference between the level of the electrons in the electron transport layer and the level of the holes in the hole transport layer.

The mode of operation of light-emitting components does not differ from the mode of operation of components which emit electromagnetic radiation close to the visible spectral range, for example infrared or ultraviolet radiation.

In the case of materials for electron transport layers, experiments have found that the energy of the LUMO should be at most −2.7 eV or less. This corresponds to a value of at most −2.1 V vs. Fc/Fc$^+$ (vs. ferrocene/ferrocenium). Standard materials which are used as materials for electron transport layers in OLEDs have such a LUMO, for example BPhen (LUMO −2.33 eV) and Alq$_3$ (LUMO −2.47 eV). In the case of materials for hole transport layers, the HOMO is preferably −4.8 eV or less, corresponding to 0 V vs. Fc/Fc$^+$ (vs. ferrocene/ferrocenium) or more.

In order to achieve a suitable doping effect, the p-dopants and n-dopants must have certain reduction potentials/oxidation potentials in order to obtain an oxidation of the matrix of the hole transport layer so as to achieve p-doping and a reduction of the matrix of the electron transport layer so as to achieve n-doping.

To determine an ionization potential, ultraviolet photoelectron spectroscopy (UPS) is the preferred method (cf. R. Schlaf et al., J. Phys. Chem. B 103, 2984 (1999)). Ionization potentials are usually determined in the solid state. However, it is in principle also possible to determine the gas ionization potentials. However, the measured values obtained by means of the two different methods differ on account of interactions which occur in the solid. One example of such an effect due to an interaction is the polarization energy of a hole which is produced as a result of photoionization (N. Sato et al., J. Chem. Soc. Faraday Trans. 2, 77, 1621 (1981)). The ionization potential corresponds to the point at which photoemission begins on the flank of high kinetic energies, i.e. the weakest bound photoelectron.

A related method, inverse photoelectron spectroscopy (IPES), is used to determine electron affinities (cf. W. Gao et al., Appl. Phys. Lett. 82, 4815 (2003)), but this is a less established method. Alternatively, the solid potentials can be estimated by means of electrochemical measurements of oxidation potentials $E_{ox}$ and reduction potentials $E_{red}$ in the solution, for example by means of cyclic voltammetry (CV) (cf. J. D. Anderson, J. Amer. Chem. Soc. 120, 9646 (1998)).

Empirical formulae for converting the electrochemical voltage scale (oxidation potentials) into the physical (absolute) energy scale (ionization potentials) are known (cf. for example B. W. Andrade et al., Org. Electron. 6, 11 (2005); T. B. Tang, J. Appl. Phys. 59, 5 (1986); V. D. Parker, J. Amer. Chem. Soc. 96, 5656 (1974); L. L. Miller, J. Org. Chem. 37, 916 (1972); Y. Fu et al., J. Amer. Chem. Soc. 127, 7227 (2005)). No correlation between reduction potential and electron affinity is known, since electron affinities can be measured only with difficulty. For the sake of simplicity, therefore, the electrochemical and physical energy scale are converted into one another using IP=4.8 eV+e*$E_{ox}$ (vs. ferrocene/ferrocenium) and EA=4.8 eV+e*$E_{red}$ (vs. ferrocene/ferrocenium) (cf. B. W. Andrade, Org. Electron. 6, 11 (2005)). The conversion of various standard potentials or redox pairs is described for example in A. J. Bard et al., "Electrochemical Methods: Fundamentals and Applications", Wiley, 2nd edition 2000. Information concerning the influence of the solvent used for the measurement can be found in N. G. Connelly et al., Chem. Rev., 96, 877 (1996).

It is customary to use the terms ionization potential and electron affinity synonymously with the terms energy (or energy layer) of the HOMO and energy (or energy layer) of the LUMO (Koopman's theory). It should be noted here that the ionization potential/electron affinity are stated in such a way that larger values signify stronger binding of the released/attached electron to the respective molecule. The energy scale of the molecular orbitals (e.g. HOMO or LUMO) is measured the other way round.

The potentials given in the present application relate to the value in the solid.

U.S. Pat. No. 5,093,698 discloses a component structure for an OLED which leads to a greatly improved charge carrier injection from the electrodes into the organic layers. This effect is based on considerable band bending of the energy levels in the organic layer at the interface to the electrodes (J. Blochwitz et al., Org. Electronics 2, 97 (2001)), as a result of which injection of charge carriers on the basis of a tunnel mechanism is possible. The high conductivity of the doped layers also prevents the voltage drop which occurs there during operation of the OLED.

The injection barriers which may occur in OLEDs between the electrodes and the charge carrier transport layers are one of the main causes for an increase in the operating voltage compared to the thermodynamically justified minimum operating voltages. For this reason, many attempts have been made to reduce the injection barriers, for example by using cathode materials with a low work function, for example metals such as calcium, magnesium or barium. However, these materials are highly reactive, difficult to process and are only suitable to a limited extent as electrode materials. Moreover, any reduction in operating voltage brought about by using such cathodes is only partial.

A further possibility for improving the injection of electrons from the cathode into the electron transport layer consists in using LiF or other lithium compounds which are incorporated as a thin layer between an aluminium cathode and the electron transport layer. It is assumed that lithium, which has a lower work function than aluminium, is formed in the process (M. Matsumura et al., Appl. Phys. Lett., 2872, (1998)). However, this method functions only when using aluminium as the cathode material. Moreover, precise control of the layer thickness for the LiF layer is necessary, since only very thin layers in the region of a few nanometers give rise to the desired effect. The method also does not function in a satisfactory manner for inverted structures, in which the cathode is deposited first, followed by the organic layer sequence.

Another possibility for improved injection from the cathode into the electron transport layer is known (cf. Bloom et al., J. Phys. Chem., 2933, (2003)), in which organometallic complexes with a low work function are incorporated as a thin layer between the cathode and the electron transport layer in OLEDs.

As anode material, in OLEDs use is usually made of materials with a relatively high work function. By way of example, use is made of transparent conductive oxides, for example indium tin oxide (ITO) or indium zinc oxide (IZO). Attempts have also been made to improve the injection of holes from ITO anodes into the hole transport layers of OLEDs. By way of example, the work function of ITO can be increased by means of targeted treatment of the ITO surface with oxygen plasma (M. Ishii et al., J. Lumin., 1165, (2000)).

Furthermore, the documents U.S. Pat. No. 6,720,573 B2 and US 2004/0113547 A1 propose the use of substituted hexaazatriphenylenes as a layer for hole injection and/or hole transport, as a result of which the injection barrier between the anode and the hole transport layer is reduced. Document US 2004/0113547 A1 suggests a "virtual electrode" which forms when using an injection layer made from hexaazatriphenylenes. It is assumed here that the material in the injection layer has a higher stability in the reduced state than in the neutral state. Furthermore, the material has a low electron mobility and a high hole mobility. It is proposed in document US 2004/0113547 A1 that free electrons from the anode material are given to the hexaazatriphenylene layer, as a result of which the modules of this layer are partially reduced. Since the electrons exhibit a low mobility in the material, they remain tight against the interface to the anode, where they form a virtual cathode. When a voltage is applied, an injection of holes from the anode into the hexaazatriphenylene layer is made easier as a result of the "virtual cathode", i.e. the negative charges, immediately next to the anode. Due to the high hole mobility of this layer, the holes then quickly continue to migrate in the direction of the actual cathode.

It is further stated in document US 2004/0113547 A1 that this injection layer leads to good results in particular with anode materials having a low work function. This finding goes against the customary attempts to use anode materials with a high work function. However, this obviously represents a restriction with regard to the usability of these materials.

Proposals are thus known both for charge carrier injection from the anode and from the cathode into the charge carrier transport layers of OLEDs. However, these are only partially able to solve the existing problems concerning injection. In particular, it is not guaranteed that the injection of charge carriers into the charge carrier transport layers will take place largely without barriers, as is the case in PIN-OLEDs.

PIN-OLED technology will be discussed in more detail below.

Furthermore, the transport of the charge carriers is a possible source of an undesired voltage drop. In undoped layers, charge transport takes place according to the theory of space charge-limited currents (cf. M. A. Lampert, Rep. Progr. Phys. 27, 329 (1964)). Here, the voltage necessary to maintain a certain current density increases as the layer thickness increases and as the charge carrier mobility decreases. Organic semiconductor materials these days have high charge carrier mobilities of more than $10^{-5}$ cm$^2$/Vs, but these are often not sufficient to ensure a charge carrier transport that is largely free of voltage losses at increased current densities such as those necessary in the operation of OLEDs with high luminances. Compared with this, a minimum layer thickness for the transport layer thicknesses must be adhered to, in order for example to avoid short-circuits between the electrodes and quenching of luminescence at the metal contacts.

For PIN-OLEDs, the conductivities of the doped layer are up to five orders of magnitude or more higher than undoped layers. The layer behaves like an ohmic conductor, as a result of which a voltage drop over the (doped) charge carrier transport layers is very low even when operating OLEDs with high current densities. With a conductivity of $10^{-5}$ S/cm for example, a voltage of 0.1 V drops over a doped organic charge carrier transport layer with a thickness of 100 nm at a current of 100 mA/cm$^2$. By contrast, in the case of an undoped charge carrier transport layer (space charge limitation of the current) with a mobility of $10^{-5}$ cm$^2$/Vs, a voltage of 5.4 V is required for this current density.

In document DE 100 58 578 C2, blocking layers were inserted between the central emission layer and at least one charge carrier transport layer. Here, the charge carrier transport layers are likewise doped with either acceptors or donors. It is described how the energy levels of the blocking materials must be selected in such a way as to restrict electrons and holes in the light-emitting zone, i.e. to prevent the charge carriers from leaving the emission zone by means of diffusion. Therefore, the known structure actually permits high efficiencies since the additional intermediate layers also act as a buffer zone for previously possible quenching effects at dopant impurity sites.

Cancellation of luminescence may be brought about by a number of effects. One possible mechanism is known as exciplex formation. In such a case, holes and electrons which are actually intended to recombine with one another on an emitter molecule in the emission zone are located on two different molecules at one of the interfaces to the emission layer. This so-called exciplex state can be understood as a charge transfer exciton, with the molecules involved being of different nature. In the event of an unsuitable choice of materials for the block and emission layer, this exciplex is the lowest possible excited state in terms of energy, so that the energy of the actually desired exciton can be transmitted to an emitter molecule in this exciplex state. This leads to a reduction in the quantum yield of the electroluminescence and thus of the OLED. This is associated with an electroluminescence of the exciplex which is shifted towards red, but which is then usually characterized by very low quantum yields.

Further mechanisms for luminescence cancellation which occur in OLEDs arise as a result of the interaction of excitons with charged or uncharged doping molecules on the one hand and/or with charge carriers on the other hand. The first mechanism is effectively suppressed by using undoped blocking layers due to the short range (for example <10 nm) of the interaction. Since charge carriers necessarily have to occur in and close to the emission zone during operation of the OLED, optimization can take place here only to the effect that an accumulation of charge carriers for example at a band discontinuity is prevented. This places particular requirements on the choice of band levels for the blocking material and the emitter, in order to prevent barriers for charge carrier injection and thus an accumulation of charge carriers.

In addition to the above-described effects of increasing the OLED efficiency by suppressing non-emitting quenching processes of the excitons, the use of intermediate layers at the interface between the transport layers and the emission zone can also fulfil the purpose of facilitating charge carrier injection into the emission zone. In order to produce visible light, it is necessary to generate excitons on the emitter molecules which have at least an energy corresponding to the wavelength of the light emitted by the OLED. This energy often corresponds to a value greater than the difference in level defined by the difference between the HOMO of the hole transport layer and the LUMO of the electron transport layer. In order then to prevent excessively high injection barriers to injection from the charge carrier transport layers into the emission zone, which could lead to an increased charge carrier density at this interface and to the formation of a space charge zone, it is often advantageous to introduce additional thin layers with thickness in the range of a few nanometers between the charge carrier transport layers and the emission zone. These should then lie, in terms of their energy, with the level of their HOMO (in the case of the hole transport layer) or their LUMO (in the case of the electron transport layer) between the charge carrier transport layers and the level of the emission zone, as a result of which the charge carrier transport is facilitated and the formation of a space charge zone is prevented.

With suitable layer arrangements, OLEDs based on PIN technology achieve very high current efficiencies while simultaneously having very low operating voltages, as a result of which it is possible to achieve extremely high performance efficiencies of more than 100 lm/W (J. Birnstock et al., IDW, Proceedings, S. 1265-1268 (2004)), which have to date not been possible with alternative technologies.

However, the production of doped charge carrier transport layers represents an additional technological obstacle in the production of an OLED. Besides the emission zone, which is often constructed by the simultaneous evaporation of two or more materials in one or more layers, for PIN OLEDs it is additionally necessary to produce the transport layers from two materials in each case. To this end, therefore, two evaporation sources are required, which have to be heated and controlled separately, which is naturally associated with a more complicated and therefore more expensive design of the production installation. Other methods for producing the OLED layers, for example by growing the layers on from a carrier gas which is loaded with the OLED materials, are also more complicated with regard to simultaneous deposition. For such methods, it must be ensured in particular that the evaporation temperatures of the materials to be deposited are advantageously as close to one another as possible, so as to prevent the possible deposition of the less volatile substance at cooler parts in the production installation. However, if the evaporation temperatures are too far apart, and thus the parts of the installation which come into contact with the gas stream have to be brought to suitably high temperatures so as to prevent such a deposition, there is a risk of chemical decomposition of the more volatile component at the hot vessel walls. Moreover, in the case of the doping of charge transport layers, it is also conceivable that a reaction between the transport matrix and the dopant may occur already in the gas phase.

Document WO 2005/086251 deals with the use of a metal complex as n-dopant for an organic semiconductive matrix material, an organic semiconductor material and an electronic component and also as dopant and ligand.

One of the main fields of application for organic light-emitting diodes is in display technology. Both in the field of passive matrix display elements and in the field of active matrix display elements, OLEDs have in recent years obtained an increasing market share, with the price pressure naturally being high. To this end, the increased technological manufacturing outlay in the production of PIN OLED components must be weighed up against the improved performance characteristic compared to conventional OLEDs, which means that under some circumstances the commercial success of PIN technology may be impaired.

SUMMARY OF THE INVENTION

The object of the invention is to provide an organic component with an improved charge carrier injection from the electrodes into an arrangement of organic layers between the electrodes.

According to the invention, this object is achieved by an organic component, in particular a light-emitting organic component, having an electrode (1; 2) and a counterelectrode (2; 1) and also an arrangement of organic layers (3) which is arranged between the electrode (1; 2) and the counterelectrode (2; 1) and which is in electrical contact with the electrode (1; 2) and the counterelectrode (2; 1), the arrangement of organic layers (3) comprising charge carrier transport layers (4, 8) for transporting charge carriers injected from the electrode (1; 2) and from the counterelectrode (2; 1) into the arrangement of organic layers (3), wherein an injection layer (5; 9) made from a molecular doping material is formed in the arrangement of organic layers (3) between the electrode (1; 2) and a charge carrier transport layer (4; 8) arranged opposite to the electrode (1; 2), which injection layer is in contact with the charge carrier transport layer (4; 8) arranged opposite to the electrode (1; 2), and the molecular doping material is provided with a molecular weight of at least 300 g/mol. The molecular doping material has a reduction potential which, with respect to $Fc/Fc^+$, is greater than or equal to approximately 0 V, if the doping material is of the p-type. The molecular doping material has an oxidation potential, which, with respect to $Fc/Fc^+$, is less than or equal to approximately −1.5 V, if the molecular doping material is of the n-type.

If the electrode is formed as an anode, the charge carrier transport layer arranged opposite to the anode is a hole transport layer and the injection layer is made from a molecular doping material of the p-type. If the electrode is formed as a cathode, the charge carrier transport layer arranged opposite to the cathode is an electron transport layer and the injection layer is made from a molecular doping material of the n-type.

It has surprisingly been found that the operating voltage during operation of the organic component can be significantly reduced by means of one or more injection layers made from molecular doping materials, as used for example in PIN OLEDs for doping charge carrier transport layers, between the electrodes and the charge carrier transport layers. The invention has made it possible to lower the application voltage to a minimum value, as has until now been possible in the case of organic light-emitting components only for OLEDs of the PIN type.

It has furthermore been found that, due to the use of the injection layer(s) made from the molecular doping material, a degradation as a result of UV light exposure of the organic component, particularly in the case of light-emitting organic components, is prevented, as a result of which the component does not exhibit any rise in operating voltage even when exposed to strong light.

The molecular doping materials are molecular substances which can be deposited by means of vacuum evaporation and without any decomposition to form layers. These are organic or inorganic substances, the molecules of which comprise at least six atoms, preferably more than twenty atoms. The molecular doping material may also be a molecular salt, in which at least two molecular sub-units are formed, the atoms in the molecular sub-units once again comprising at least six atoms, preferably more than twenty atoms. Analogously, the molecular doping material may be a molecular charge transfer complex, the atoms of which satisfy the aforementioned conditions. The molecular doping materials have a molecular weight of at least 300 g/mol.

In one advantageous embodiment of the invention, if the electrode is formed as an anode, the counterelectrode is a cathode, and a further injection layer made from a further molecular doping material of the n-type is formed in the arrangement of organic layers between the cathode and an electron transport layer arranged opposite to the cathode, which further injection layer is in contact with the electron transport layer arranged opposite to the cathode, the further molecular doping material of the n-type having a molecular weight of at least 300 g/mol. As a result, in addition to the improved injection of charge carriers from the electrode, the injection of charge carriers from the counterelectrode can also be improved. The charge carrier balance in the component is improved, resulting in an increase in efficiency in the case of OLEDs. Moreover, the operating voltage is also reduced since a lower injection barrier now exists at the two electrodes.

In one purposeful embodiment of the invention, it may be provided that the charge carrier transport layer arranged opposite to the electrode is a doped charge carrier transport layer. As a result, the advantageous effects of the invention are combined with the positive properties of doped transport layers. Such an arrangement leads to an improved UV stability and to a further improved injection of charge carriers, as a result of which the operating voltage may be further reduced.

One further development of the invention provides that the charge carrier transport layer arranged opposite to the electrode is doped with the molecular doping material. As a result, no additional sources are required, the manufacturing process may become less expensive and fewer different materials are required.

In one preferred embodiment of the invention, it may be provided that the charge carrier transport layer arranged opposite to the counterelectrode is a doped charge carrier transport layer. One further development of the invention provides that the charge carrier transport layer arranged opposite to the electrode is doped with the further molecular doping material.

In one preferred further development of the invention, it is provided that the injection layer is formed with a thickness of between approximately 0.1 nm and approximately 100 nm, preferably with a thickness of between approximately 0.5 nm and approximately 10 nm. Advantageously, one development of the invention provides that the further injection layer is formed with a thickness of between approximately 0.1 nm and approximately 100 nm, preferably with a thickness of between approximately 0.5 nm and approximately 10 nm. By means of thin layers, a minimization of possible absorption losses and of material consumption can be achieved.

In one preferred embodiment of the invention, it may be provided that the injection layer is in contact with the electrode. Alternatively, in one advantageous further development of the invention, it is provided that a metal layer which is in contact with the electrode and the injection layer is formed between the electrode and the injection layer. An injection of charge carriers also takes place from the metal intermediate layer into the charge carrier transport layers, so that an improvement in the injection properties is also achieved at this point.

In one preferred embodiment of the invention, it may be provided that the further injection layer is in contact with the counterelectrode. In an alternative embodiment, one development of the invention provides that a further metal layer which is in contact with the counterelectrode and the further injection layer is formed between the counterelectrode and the further injection layer.

In one preferred further development of the invention, it is provided that one or a plurality of the organic layers in the arrangement of organic layers are deposited by means of vacuum evaporation. It may also be provided that one or a plurality of the organic layers in the arrangement of organic layers are formed as polymer layers.

For the technical production process, it is also advantageous if the molecular doping materials that are used can be processed in a vacuum process. One preferred embodiment of the invention provides that the molecular doping material and/or the further molecular doping material have a minimum evaporation temperature of at least 100° C., preferably of at least 140° C., more preferably of at least 160° C. This ensures that the doping material is not transported away into other functional layers of the component, which could result in negative effects on the performance of the component. Particularly for use of the materials in mass production processes, the evaporation temperature and the vapour pressure of the doping materials are two critical parameters, which is why evaporation temperatures that are too low or vapour pressures that are too high at room temperature are a criterion for excluding otherwise suitable materials in a production process.

Furthermore, it is advantageous if the molecular doping materials can be purified by means of evaporation, so that the doping material is used in a high degree of purity when producing the component. To this end, it is provided that the doping material is able to undergo sublimation at a temperature considerably below the thermal decomposition temperature of the doping material. The difference between the evaporation temperature and the decomposition temperature is at least approximately 20° C., preferably at least approximately 40° C., more preferably at least approximately 60° C. This also ensures that, during production of the component, no decomposition of the doping material in the production installation and thus no soiling of the latter occurs. Advantageously, therefore, one development of the invention provides that, for the molecular doping material and/or the further molecular doping material, a difference between the evaporation temperature and the decomposition temperature is at least 20° C., preferably at least approximately 40° C., more preferably at least approximately 60° C.

One preferred embodiment of the invention provides that the molecular doping material of the p-type has a reduction potential which, with respect to $Fc/Fc^+$, is greater than or equal to approximately 0.18 V, preferably greater than or equal to approximately 0.24 V. The reduction potentials can be determined for example by means of cyclic voltammetry of the substances in a suitable solvent, for example acetonitrile. Detailed information concerning the carrying out of cyclic voltammetry and other methods for determining reduction potentials and the relationships between the reference electrode ferrocene/ferrocenium ($Fc/Fc^+$) and other reference electrodes can be found in A. J. Bard et al., "Electrochemical Methods: Fundamentals and Applications", Wiley, 2nd edition 2000. The greater the reduction potential, the greater the range of materials that can be used as hole transport layer. As a result, it is possible to use inexpensive materials that are more stable (UV/temperature) and have a longer life.

One preferred embodiment of the invention provides that the counter electrode is a cathode, the charge carrier transport layer arranged opposite to the cathode is an electron transport layer and the further injection layer is made from a molecular doping material of the n-type.

One preferred embodiment of the invention provides that the molecular doping material of the n-type has an oxidation potential which, with respect to $Fc/Fc^+$, is less than or equal to approximately −2.0 V, preferably less than or equal to approximately −2.2 V. The lower the oxidation potential, the greater the range of materials that can be used as electron transport layer.

When using undoped charge carrier transport layers, there is no need to produce the charge carrier transport layers by means of the simultaneous evaporation of a plurality of materials, as a result of which the production process is simplified compared to the formation of doped layers.

The invention brings about the described advantages particularly in connection with light-emitting organic components. One preferred embodiment of the invention provides that the arrangement of organic layers comprises a light-emitting region, with the result that a light-emitting organic component is formed. In one refinement, it is optionally possible to omit intermediate layers between the charge carrier transport layers and the light-emitting region, since in the case of omitting doped transport layers no luminescence cancellation can occur as a result of the interaction of excitons with charged or uncharged doping molecules.

In one advantageous further development of the invention, it is provided that the light-emitting organic component is top emitting. Advantageously, an alternative development of the invention provides that the light-emitting organic component is bottom-emitting. It may be provided that the light-emitting organic component is transparent. An inverted arrangement may also be provided.

DESCRIPTION OF PREFERRED EMBODIMENTS OF THE INVENTION

The invention will be explained in more detail below on the basis of examples of embodiments and with reference to the figures of a drawing, in which.

Figure 3:
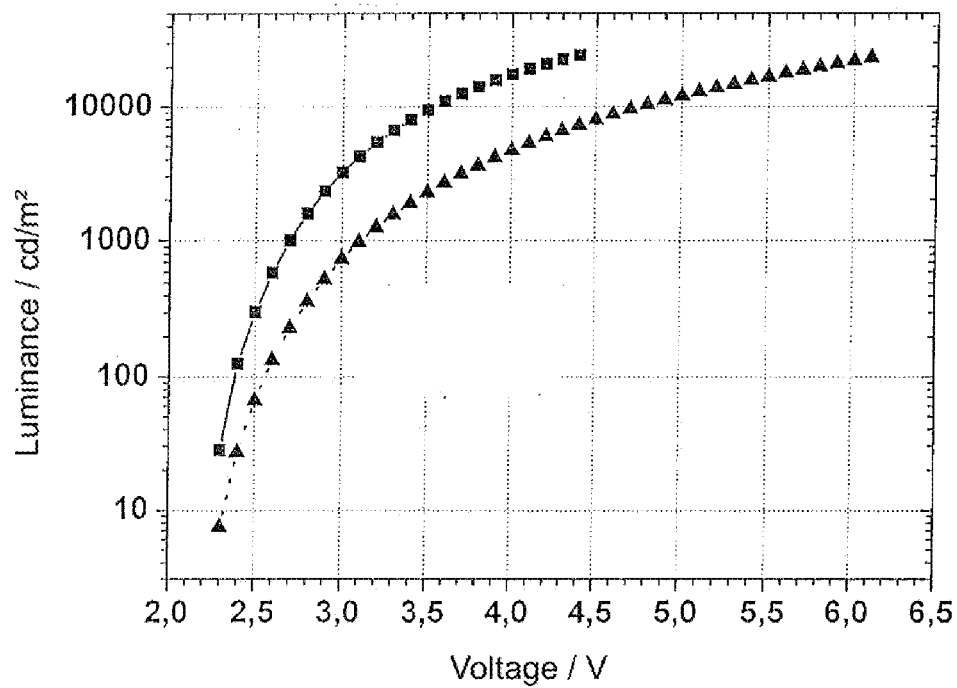
Figure 4:
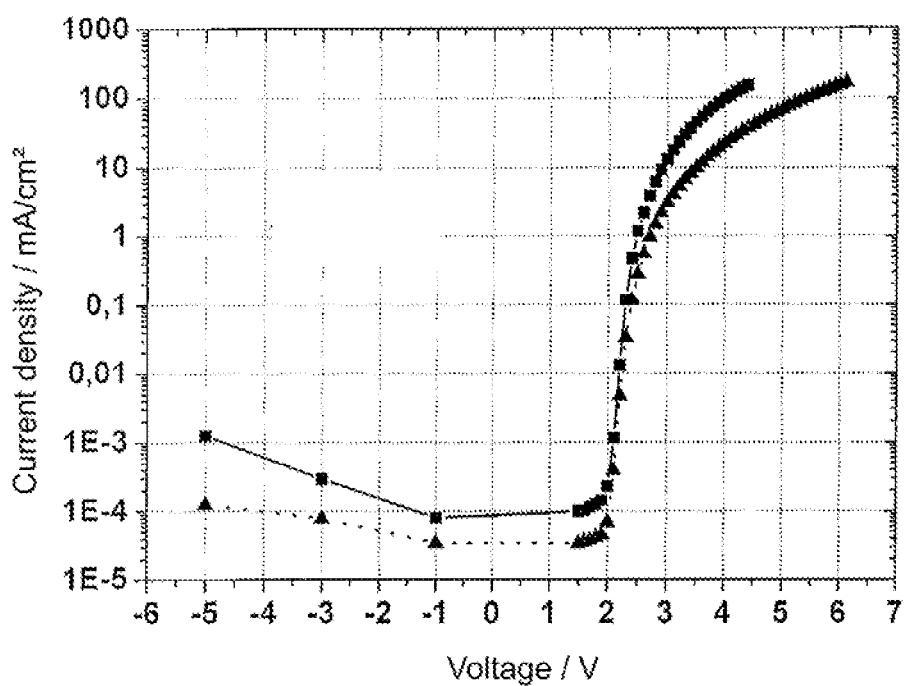

FIG. 3 shows an illustration in graph form of the luminance as a function of the voltage for an organic light-emitting diode according to the invention and an organic PIN light-emitting diode according to the prior art; and FIG. 4 shows an illustration in graph form of the current density as a function of the voltage for an organic light-emitting diode according to the invention and the organic PIN light-emitting diode according to the prior art.

Figure 1:
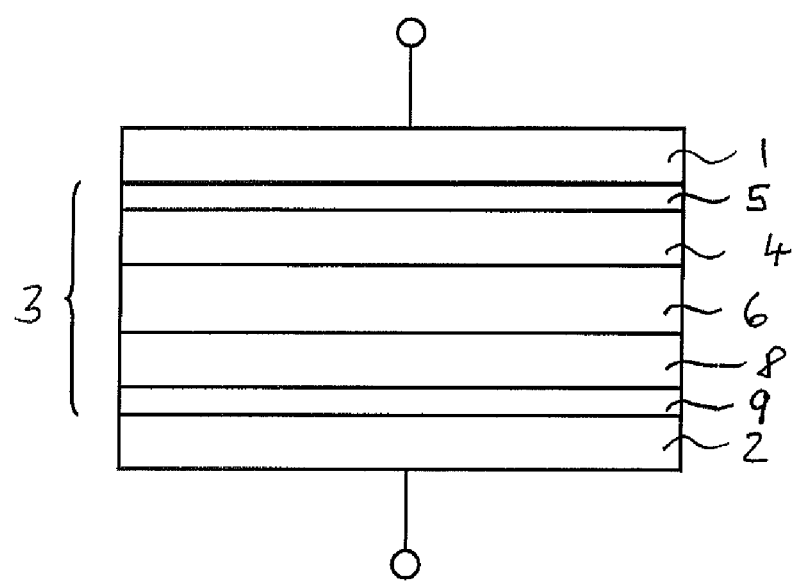
FIG. 1 shows a schematic diagram of an organic component, in which an arrangement of organic layers is arranged between an anode and a cathode.

FIG. 1 shows a schematic diagram of an organic component, in which an arrangement of organic layers 3 is formed between an anode 1 and a cathode 2. An electrical voltage can be applied to the arrangement of organic layers 3 via the anode 1 and the cathode 2. Such a structure can be integrated in various organic components, for example diodes, light-emitting diodes, photodiodes or the like.

The arrangement of organic layers 3 comprises a hole transport layer 4 arranged opposite to the anode 1. By means of the hole transport layer 4 in the arrangement of organic layers 3, holes which, when the electrical voltage is applied, are injected from the anode 1 via an anode-side injection layer 5 made from a molecular doping material of the p-type are transported to an active zone 6. As the molecular doping material of the p-type, use may be made for example of the following material: 2-(6-dicyanomethylene-1,3,4,5,7,8-hexafluoro-6H-naphthalen-2-ylidene)-malononitrile.

The active zone 6 is for example a light-emitting zone, in which the holes and electrons recombine and in doing so emit light.

According to FIG. 1, the arrangement of organic layers 3 further comprises an electron transport layer 8 arranged opposite to the cathode 2. By means of the electron transport layer 8 in the arrangement of organic layers 3, electrons which, when the electrical voltage is applied, are injected from the cathode 2 via a cathode-side injection layer 9 made from a molecular doping material of the n-type are transported to the active zone 6. As the molecular doping material of the n-type, use may be made for example of the following material: tetrakis(1,3,4,6,7,8-hexahydro-2H-pyrimido[1,2-a]pyrimidine) ditungsten(II).

Figure 2:
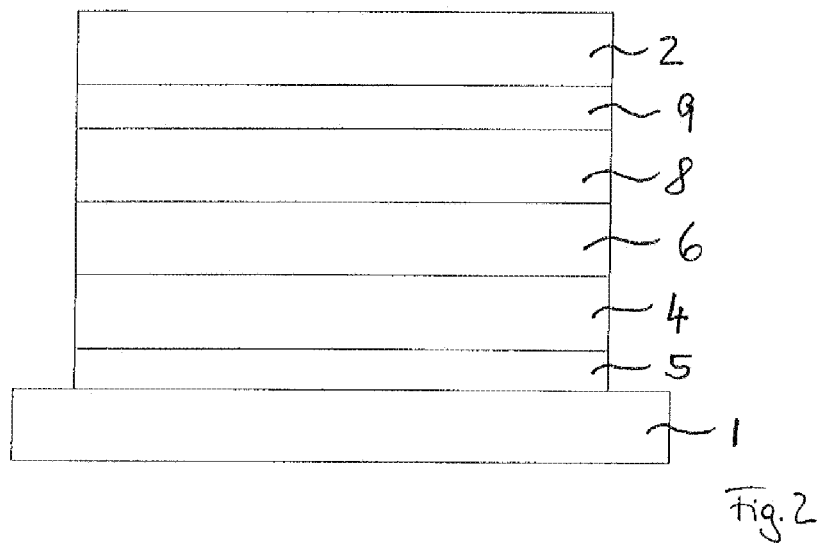
FIG. 2 shows a schematic diagram of a light-emitting organic component, in which the arrangement of organic layers comprising a light-emitting layer is arranged between the anode and the cathode.

FIG. 2 shows a schematic diagram of a light-emitting organic component, in which the arrangement of organic layers 3 comprising the active zone 6 designed as a light-emitting layer is arranged between the anode 1 and the cathode 2.

The organic components shown in FIGS. 1 and 2 may in other embodiments (not shown) comprise further layers in the arrangement of organic layers 3 or outside the arrangement of organic layers 3. For example, particularly for light-emitting organic components, embodiments are known in which intermediate layers which serve to block charge carriers are provided.

FIG. 3 shows an illustration in graph form of the luminance as a function of the voltage for an organic light-emitting diode according to the invention (OLED according to the invention; triangles) and an organic PIN light-emitting diode according to the prior art (PIN-OLED according to the prior art; squares).

FIG. 4 shows an illustration in graph form of the current density as a function of the voltage for the OLED according to the invention (triangles) and the PIN-OLED according to the prior art (squares).

In order to produce the two OLEDs, the organic layers and the metal layers were deposited by means of thermal evaporation onto ITO-coated glass in an ultra-high-vacuum system at a pressure of approximately $10^{-7}$ mbar, without interrupting the vacuum during the production process. The deposition rates and deposition thicknesses were monitored by means of crystal oscillators.

The OLED according to the invention has the following structure:
1.1) 2 nm 2-(6-dicyanomethylene-1,3,4,5,7,8-hexafluoro-6H-naphthalen-2-ylidene)malononitrile
1.2) 50 nm 2,2',7,7'-tetrakis(N,N-dimethylphenylamino)-9,9'-spirobifluorene
1.3) 10 nm NPB
1.4) 20 nm NPB doped with 10% iridium(III) bis(2-methyldibenzo[f,h]quinoxaline) (acetylacetonate)
1.5) 70 nm 2,4,7,9-tetraphenylphenanthroline
1.6) 2 nm tetrakis(1,3,4,6,7,8-hexahydro-2H-pyrimido[1,2-a]pyrimidine) ditungsten(II)
1.7) 100 nm aluminium This is a red OLED with an emission maximum at 615 nm. The sample reaches a brightness of 1000 cd/m² at a voltage of 3.1 V. The current efficiency at this brightness is 24 cd/A.

The OLED according to the prior art which is produced as reference has the following structure:
2.1) 50 nm 2,2',7,7'-tetrakis(N,N-dimethylphenylamino)-9,9'-spirobifluorene doped with 4% 2-(6-dicyanomethylene-1,3,4,5,7,8-hexafluoro-6H-naphthalen-2-ylidene)malononitrile
2.2) 10 nm NPB
2.3) 20 nm NPB doped with 10% iridium(III) bis(2-methyldibenzo[f,h]quinoxaline) (acetylacetonate)
2.4) 10 nm 2,4,7,9-tetraphenylphenanthroline
2.5) 60 nm 2,4,7,9-tetraphenylphenanthroline doped with 2% tetrakis(1,3,4,6,7,8-hexahydro-2H-pyrimido[1,2-a]pyrimidine) ditungsten(II)
2.6) 100 nm aluminium This is a red OLED of the PIN type with an emission maximum at 610 nm. The OLED reaches a brightness of 1000 cd/m² at a voltage of 2.7 V. The current efficiency at this brightness is 26 cd/A.

The curve in FIG. 4 shows that, at low current densities, firstly an identical rise is achieved both for the OLED according to the invention and for the OLED according to the prior art. Only from a current density of 0.1 mA/cm² is there a difference in the curves. There is a slower rise in the curve for the OLED according to the invention. For a current density of 10 mA/cm², a voltage that is 0.5 V lower is required for the OLED according to the prior art than for the OLED according to the invention.

The injection of charge carriers from the anode and from the cathode takes place without any barriers, so that no additional voltage drop occurs on account of a contact resistance. In particular, the threshold voltage is only 2.0 V. On the other hand, the energy of the photons emitted by the component is also only 2.0 eV. This also means that no contact resistances occur in the OLED according to the invention and the OLED according to the prior art.

It is surprising that the rise in voltage for reaching certain current densities in the comparison of the OLED according to the invention and the OLED according to the prior art is as low as this. This is the case even though the total layer thickness of the undoped charge transport layers in the OLED according to the invention is more than 100 nm thick.

This is also surprising in particular in comparison with the prior art. Injection layers made from materials with a high reduction potential of 0.6 V to 0 V as hole injection layer (cf. US 2004/0113547 A1) and with a low oxidation potential of 1.28 V to 1.44 V, measured by cyclic voltammetry against a standard hydrogen electrode (Bloom et al., J. Phys. Chem., 2933, (2003)), as injection layer for electrons are known. For the known injection layers from the document US 2004/0113547 A1, special anode materials with a low work function are required in order to achieve low operating voltages. The threshold voltages achieved are higher compared to the present invention, and the curves have a flatter profile. The known materials with a low oxidation potential (cf. Bloom et al., J. Phys. Chem., 2933, (2003)) also exhibit higher threshold voltages compared to the present invention.

By using injection layers made from doping materials which are suitable for the doping of charge carrier transport layers in PIN-OLEDs, it is possible to achieve a significant improvement compared to the prior art. In particular, the electron affinity of the p-dopant used on the anode side is higher than in the document US 2004/0113547 A1. Likewise, the ionization potential of the n-dopant used on the cathode side is lower than in the prior art (cf. Bloom et al., J. Phys. Chem., 2933, (2003)). Only as a result can significantly steeper curves be achieved while at the same time having a low threshold voltage of the OLED component. As a result, significantly higher performance efficiencies can be achieved. This development step compared to the prior art is surprising and is neither derived from nor made obvious by the previous works. Due to the possibility of using thick transport layers, the production process is not sensitive to variations in layer thickness, as a result of which the production yield is increased and the total cost of producing the component is reduced.

Particularly for a brightness range up to 1000 cd/m², the difference in operating voltages between the OLED according to the invention and the OLED according to the prior art is small. For a large number of possible applications, for example for active matrix display elements or lighting elements, brightnesses of 1000 cd/m² and less are entirely sufficient. Therefore, particularly for possible applications with low to medium component brightnesses, the invention represents a very good alternative to PIN technology. By means of the invention, it is possible to prevent it from being necessary to carry out the simultaneous evaporation of doped charge carrier transport layers in order to achieve low operating voltages. Moreover, it is optionally possible to omit layers which in PIN-OLEDs are required in order to achieve high efficiencies. This relates to the undoped thin intermediate layers at the interface between the charge carrier transport layers and the emission zone, which are usually required in PIN-OLEDs.

The features of the invention which are disclosed in the above description, the claims and the drawing may be important both individually and in any combination with one another for implementing the invention in its various embodiments.

The invention claimed is:

1. An organic component comprising an electrode, a counterelectrode, and an arrangement of organic layers, wherein the arrangement of organic layers is arranged between the electrode and the counterelectrode, wherein the arrangement of organic layers is in electrical contact with the electrode and the counterelectrode, and wherein the arrangement of organic layers comprises one or more charge carrier transport layers that transport charge carriers injected from the electrode and the counterelectrode into the arrangement of organic layers, wherein the arrangement of organic layers comprises a first injection layer, wherein the first injection layer consists of a first molecular material that is suitable for doping charge carrier transport layers, wherein the first injection layer is arranged between the electrode and a charge carrier transport layer arranged opposite to the electrode, wherein the first injection layer is in contact with the charge carrier transport layer arranged opposite to the electrode, and the first molecular material has a molecular weight of at least 300 g/mol, and wherein the first molecular material is a p-type material, the p-type material has a reduction potential which, with respect to Fc/Fc⁺, is greater than or equal to about 0 V, the electrode is an anode, and the charge carrier transport layer arranged opposite to the anode is a hole transport layer, wherein the counterelectrode is a cathode, and the arrangement of organic layers comprises a second injection layer, wherein the second injection layer consists of a second molecular material of the n type that is suitable for doping charge carrier transport layers, wherein the second injection layer is arranged between the cathode and an electron transport layer arranged opposite to the cathode, wherein the second injection layer is in contact with the electron transport layer arranged opposite to the cathode, and wherein the second molecular material of the n-type has a molecular weight of at least 300 g/mol.

2. The organic component according to claim 1, wherein the charge carrier transport layer arranged opposite to the electrode is a doped charge carrier transport layer.

3. The organic component according to claim 2, wherein the charge carrier transport layer arranged opposite to the electrode is doped with the first molecular material.

4. The organic component according to claim 1, wherein the charge carrier transport layer arranged opposite to the counterelectrode is a doped charge carrier transport layer.

5. The organic component according to claim 4, wherein the charge carrier transport layer arranged opposite to the counterelectrode is doped with the second molecular material.

6. The organic component according to claim 1, wherein the first injection layer has a thickness of between about 0.1 nm and about 100 nm.

7. The organic component according to claim 1, wherein the second injection layer has a thickness of between about 0.1 nm and about 100 nm.

8. The organic component according to claim 1, wherein the first injection layer is in contact with the electrode.

9. The organic component according to claim 1, wherein the organic component comprises a metal layer, wherein the metal layer is in contact with the electrode and the first injection layer, and wherein the metal layer is arranged between the electrode and the first injection layer.

10. The organic component according to claim 1, wherein the second injection layer is in contact with the counterelectrode.

11. The organic component according to claim 1, wherein the component comprises a second metal layer, wherein the second metal layer is in contact with the counterelectrode and the second injection layer, and wherein the second metal layer is arranged between the counterelectrode and the second injection layer.

12. The organic component according to claim 1, wherein one or more of the organic layers in the arrangement of organic layers comprise vacuum evaporated layers.

13. The organic component according claim 1, wherein one or more of the organic layers in the arrangement of organic layers comprise polymer layers.

14. The organic component according to claim 1, wherein the first molecular material or the second molecular material has a minimum evaporation temperature of at least 100° C.

15. The organic component according to claim 1, wherein, for the first molecular material or the second molecular material, the difference between the evaporation temperature and the decomposition temperature is at least 20° C.

16. The organic component according to claim 1, wherein the first molecular material of the p-type has a reduction potential which, with respect to Fc/Fc⁺, is greater than or equal to about 0.18 V.

17. The organic component according to claim 1, wherein the second molecular material of the n-type has an oxidation potential which, with respect to Fc/Fc⁺, is less than or equal to about −1.5 V.

18. The organic component according to claim 1, wherein the arrangement of organic layers comprises a light-emitting region.

19. The organic component according to claim 18, wherein the light-emitting organic component is top-emitting.

20. The organic component according to claim 18, wherein the light-emitting organic component is bottom-emitting.

21. The organic component according to claim 18, wherein the light-emitting organic component is transparent.

22. The organic component according to claim 1, wherein the first injection layer has a thickness of between about 0.5 nm and about 10 nm.

23. The organic component according to claim 1, wherein the second injection layer has a thickness of between about 0.5 nm and about 10 nm.

24. The organic component according to claim 1, wherein the first molecular material or the second molecular material has a minimum evaporation temperature of at least 140° C.

25. The organic component according to claim 1, wherein the first molecular material or the second molecular material has a minimum evaporation temperature of at least 160° C.

26. The organic component according to claim 1, wherein, for the first molecular material or the second molecular material, the difference between the evaporation temperature and the decomposition temperature is at least 40° C.

27. The organic component according to claim 1, wherein, for the first molecular material or the second molecular material, the difference between the evaporation temperature and the decomposition temperature is at least 60° C.

28. The organic component according to claim 1, wherein the first molecular material of the p-type has a reduction potential which, with respect to $Fc/Fc^+$, is greater than or equal to about 0.24 V.

29. The organic component according to claim 1, wherein the first molecular material of the n-type has an oxidation potential which, with respect to $Fc/Fc^+$, is less than or equal to about −2.2 V.

30. The organic component according to claim 1, wherein the second molecular material of the n-type has an oxidation potential, which with respect to $Fc/Fc^+$, is less than or equal to about −2.0 V.

31. The organic component according to claim 1, wherein the second molecular material of the n-type has an oxidation potential, which with respect to $Fc/Fc^+$, is less than or equal to about −2.2 V.

* * * * *